United States Patent [19]
Hatakeyama

[11] Patent Number: 5,907,515
[45] Date of Patent: May 25, 1999

[54] SEMICONDUCTOR MEMORY DEVICE

[75] Inventor: Atsushi Hatakeyama, Kawasaki, Japan

[73] Assignee: Fujitsu Limited, Kanagawa, Japan

[21] Appl. No.: 09/087,660

[22] Filed: Jun. 7, 1998

[30] Foreign Application Priority Data

Dec. 9, 1997 [JP] Japan .................................... 9-338317

[51] Int. Cl.$^6$ ................................ G11C 7/00; G11C 8/00
[52] U.S. Cl. ...................... 365/200; 365/201; 365/230.03
[58] Field of Search .................................... 365/200, 201, 365/230.03, 230.06, 189.08

[56] References Cited

U.S. PATENT DOCUMENTS

| 4,473,895 | 9/1984 | Tatematsu | 365/200 |
| 5,740,120 | 4/1998 | Okamura | 365/230.03 |

Primary Examiner—Trong Phan
Attorney, Agent, or Firm—Nikaido Marmelstein Murray & Oram, LLP

[57] ABSTRACT

A structure of a redundant cell array applicable for a compression test in which a defective cell is detected by concurrently selecting cells in a plurality of segments is provided. In the structure of the redundant cell array in a semiconductor storage device according to the present invention, areas for the compression test in which data write and read are performed by concurrently selecting memory cells in a plurality of segments SGM can be replaced to a redundancy cell array 30. That is, at least, one part of addresses Y0 and Y1 decoded by a column decoder 40 is stored in a redundant ROM of a redundancy detector 34 and is replaced to the redundant cell array 30 when the addresses coincide with the stored address. In this case, at least, one part of the addresses Y2 and Y3 decoded by a segment decoder 50 is supplied to a redundant column decoder 36 provided for the redundant cell array 30.

5 Claims, 9 Drawing Sheets

SEMICONDUCTOR MEMORY DEVICE

BACKGROUND OF THE INVENTION

1. Field of the Invention

The present invention relates to a semiconductor memory device of a large storage capacity. More particularly, it relates to a semiconductor memory device including a structure of redundant memory cell arrays which is adaptable to a data compression test for concurrently reading out data in cells of a plurality of segments.

2. Description of the Related Art

A storage capacity of a semiconductor memory device, such as a dynamic RAM (DRAM) or static RAM (SRAM), goes on increasing. According to the increase, a redundant cell array is provided in addition to a normal memory cell array to maintain a high belief of a defective cell, bit or word. If a defective bit is detected on the normal cell array, the bit is replaced to a normal bit of the redundant cell array.

On the other hand, according to the increase of the storage capacity of the memory device, a normal memory array is divided into a plurality of segments to save the consumption power. A plurality of memory cells arranged as a matrix, a plurality of bit lines linked to these memory cells and sense amplifiers for detecting potentials of each bit lines are provided in each segment. The outputs from the plurality of sense amplifiers are connected to common data bus lines through column gates. The data bus line is connected to a sense buffer for reading the common data bus or a write amplifier for writing the data bus lines in the segment. The output from the segment is connected to an I/O circuit through main data bus lines commonly used in the plurality of segments.

FIG. 1 shows a structure of a redundant cell array of the conventional semiconductor memory device. In FIG. 1, an example of a DRAM in which a memory cell MC is formed of one transistor and one capacitor is shown. In this example, four segments SGM0 to SGM3 are provided in a normal cell array 20. Each segment includes memory cells MC disposed at crossings between a word line WL and bit line pair BL and /BL, sense amplifiers SA for detecting potential differences between bit lines pair BL and /BL, as illustrated in a segment SGM0 of FIG. 1. In the example of FIG. 1, a segment SGM0 includes four columns each of which bit line pair are connected to data bus lines DB and /DB commonly used in the segment through column gates 42. The data bus lines DB and /DB are connected to a sense buffer and write amplifier 44 commonly used in the segment.

Then, the outputs from the sense buffers 44 in each of the segments SGM0 to SGM3 are connected to a main data bus line MDB commonly used in the plurality of segments. The main data bus line MDB is connected to an I/O circuit, not shown in FIG. 1.

The outputs from the plurality of sense amplifiers SA in each of the segments are connected to a sense buffer 44 through column gates 42. This column gate 42 is selected by column selection signals CL1 to CL3 generated by a column decoder 40. In the example of FIG. 1, column selection signals CL0 to CL3 are commonly supplied to the plurality of segments.

A redundant cell array 30 is provided in the example of FIG. 1. Redundant cell array 30 having the same capacity as that of each segment includes four bit line pairs, sense amplifiers, column gates, and data bus line pair RDB and /RDB for common redundancy, and further includes a commonly used sense buffer and write amplifier 32 for the redundant cell array 30. The output from sense buffer and write amplifier 32 is connected to the common main data bus line MDB.

On the other hand, a segment decoder 50 decodes column addresses Y2 and Y3, generates segment selection signals SGS0 to SGS3 for selecting one segment in normal cell array 20 and supplies the generated signals to each sense buffers 44. The output from sense buffers 44 in one segment selected by segment selection signals SGS0 to SGS3 is output to main data bus line pair MDB. In the drawing, only one line is shown for the main data bus line pair MDB.

In the example of FIG. 1, redundant cell array 30 is replaced to one segment including a defective memory cell or bit in normal cell array 20. Therefore, a redundant address ROM in a redundancy detector 34 stores column addresses Y2 and Y3 for selecting the segment in which the defective memory cell or bit exists. Redundancy detector 34 compares the supplied column addresses Y2 and Y3 with addresses in the redundancy ROM, outputs a redundant selection signal RSGS for selecting redundant cell array 30, and together, deactivates segment decoder 50 so as to inhibit to output segment selection signals SGS0 to SGS3 when both addresses are coincided. As a result, data transmitted from redundancy cell array 30 is output to main data bus MDB instead of one segment in normal cell array 20.

Hereupon, there is a need for testing normal activation of a memory. In the test, data of 0 or 1 is written to a memory cell, the data in the memory cell is read out, and it is checked whether or not the read data is coincided with the written data. However, according to the increase of a storage capacity of a memory, if the above-described test is executed to all of memory cells in order, huge test time is required, and therefore, it is not applicable for practical use.

Then, a compression test is proposed in general. In the compression test, data of 0 or 1 is concurrently written to a plurality of memory cells, and data of the plurality of memory cells are concurrently read out after that, zero is output if all of the read data are coincided with zero, 1 is output if all of the read data are coincided with 1, and an output becomes high impedance and nothing is output when at least one of all the read data is different. This enables the concurrent test for a plurality of memory cells, and therefore, makes time required for the test reduce shortly.

In the above-described compression test, as shown in FIG. 1, memory cells in each segment are concurrently selected, the outputs from sense buffers 44 in each segment are supplied to a test circuit 52 through commonly-used main data bus line pair MDB. In other word, in the compression test, a word line WL is selected and the data are concurrently written to memory cells corresponding to each segment by a column selection signal transmitted from column decoder 40 in FIG. 1. When concurrently reading out the data from the plurality of segments, main data bus line pair MDB are pre-charged to H level, sense buffers 44 in each segment are concurrently activated, for example, one of the main data bus line pair MDB is driven to L level according to the read data. Therefore, when all of the read data are the same, one of main data bus line pair MDB corresponding to the data is driven to L level, and both of the main data bus line pair MDB are also driven to L level when at least one of the read data is different. Accordingly, this enables the detection of the conditions of the read data as all H level, all L level or incoincidence by employing the main data bus line pair MDB.

However, in the above-described compression test, it is impossible to detect in which segment the defect memory cell or bit exists. Therefore, in the structure in which redundancy cell array 30 is replaced for each segment of FIG. 1, the segment to be replaced to redundancy cell array 30 cannot be detected according to the above-described compression test. Therefore, the above-described compression test is employed only in a test after replacing the segment to the redundancy cell array, exclusively, i.e., writing the data to a redundant ROM in a redundancy detector 34.

SUMMARY OF THE INVENTION

Accordingly, it is an object of the present invention to provide a structure of a redundant cell array in which a cell area to be replaced to a redundant cell array can be detected by a compression test.

It is another object of the present invention to provide a semiconductor memory device in which defective area detected by the compression test can be replaced to a redundant cell array.

In a structure of a redundancy cell array in the semiconductor memory device according to the present invention, areas of a compression test for concurrently selecting memory cells of a plurality of segments, writing and reading the data can be replaced to a redundancy cell array. In other word, at least, one part of addresses decoded by a column decoder is stored in a redundant ROM of a redundancy detector, and when the part of addresses is coincided, the area is replaced to the redundancy cell array. In such circumstance, at least, one part of addresses decoded by the segment decoder is supplied to a column decoder for a redundancy cell array.

Additionally, when the semiconductor memory device has a structure of multiple bits inputs and outputs in which a plurality of main data buses are connected to one segment, each segment includes plural sub segments corresponding to the multiple bits. In the semiconductor memory device, the structure of the redundant cell array according to the present invention further includes a redundant input and output bit selector which stores information of the sub segment corresponding to which main data bus is replaced to a redundant cell array in addition to the above-described structure. Then, a redundant cell array is connected to the main data bus of input and output bits selected from the redundancy input/output bit selector, and selection of sub segments corresponding to the above-described selected input/output bit in a normal cell array is inhibited.

The above-described objects are achieved by a semiconductor memory device according to the present invention comprising: a normal cell array including a plurality of segments each having a common data bus; a redundant cell array including a redundant common data bus; a main data bus commonly provided to the common data buses of the plurality of segments and to the redundant common data bus of the redundancy cell array: wherein cell array areas in the plurality of segments are replaceable to a cell array area in the redundancy cell array.

According to the present invention, when cells in a plurality of segments are concurrently selected and a defective cell is detected, areas including the concurrently selected cell arrays can be replaced to a redundant cell array. Therefore, it is possible to make a structure of a redundant cell array suitable to a memory for executing a compression test.

Additionally, these objects are achieved by a semiconductor memory device according to the present invention comprising: a normal cell array including M segments (M means plural) each having N sub segments (N means plural) each having a common data bus; a redundant cell array having a redundant common data bus; and N main data buses commonly provided to data buses of corresponding M sub segments in the plurality of segments, wherein cell array areas in the corresponding M sub segments in the plurality of segments are structured to be replaceable to a cell array area connected to the redundant common data bus in the redundancy cell array.

According to the present invention, when a defective cell is detected by concurrently selecting the corresponding sub segments in the plurality of segments and executing a defective cell test in a memory having the plurality of main data buses for outputting multiple bits, areas including the concurrently selected cell arrays can be replaced to a redundancy cell array.

DESCRIPTION OF THE PREFERRED EMBODIMENTS

Embodiments according to the present invention will be now explained in accompanying with the attached drawings. However, the technical scope of this invention is not restricted by those embodiments.

Figure 1:
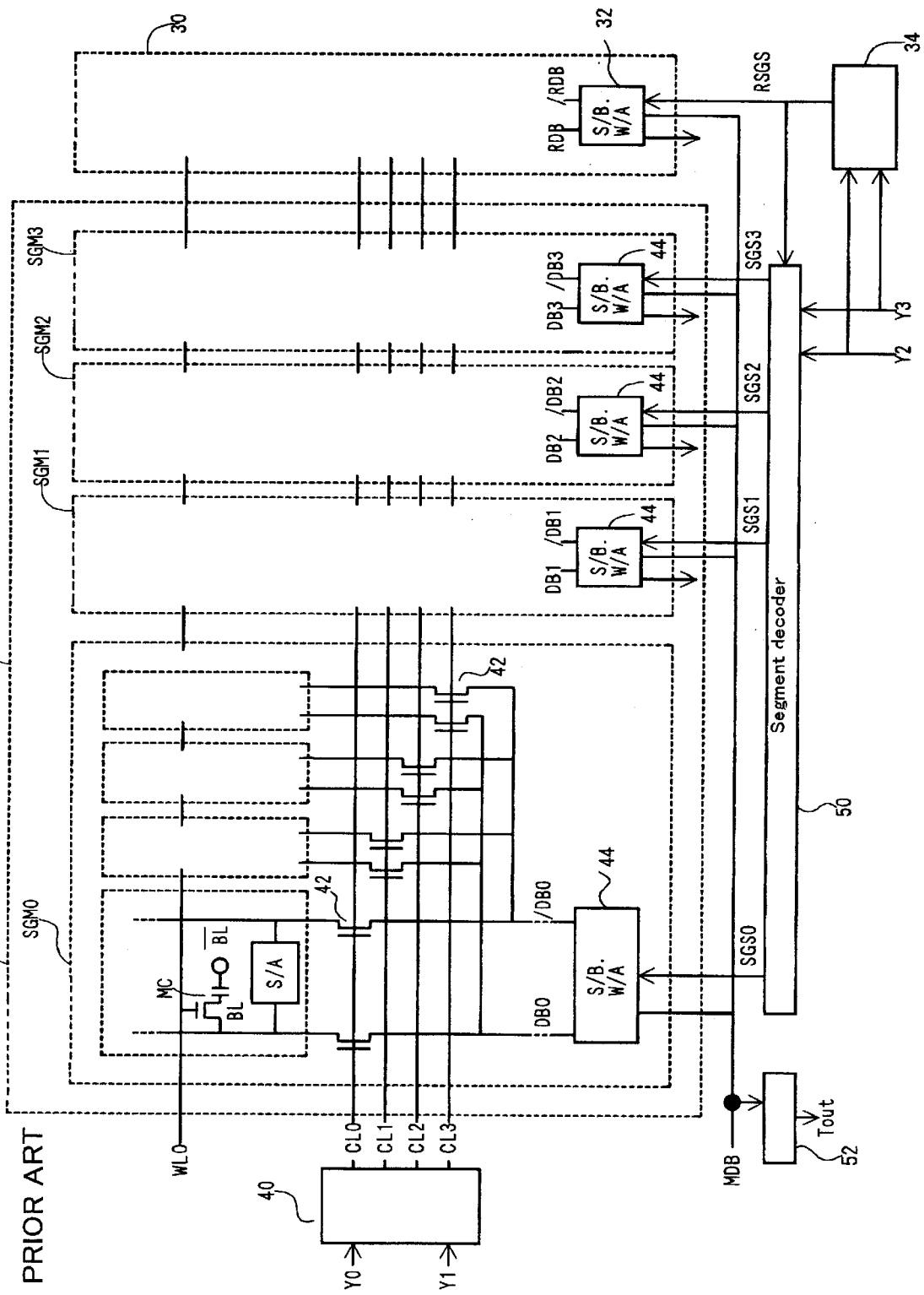
FIG. 1 shows a structure of a redundant cell array of the conventional semiconductor memory device.
Figure 2:
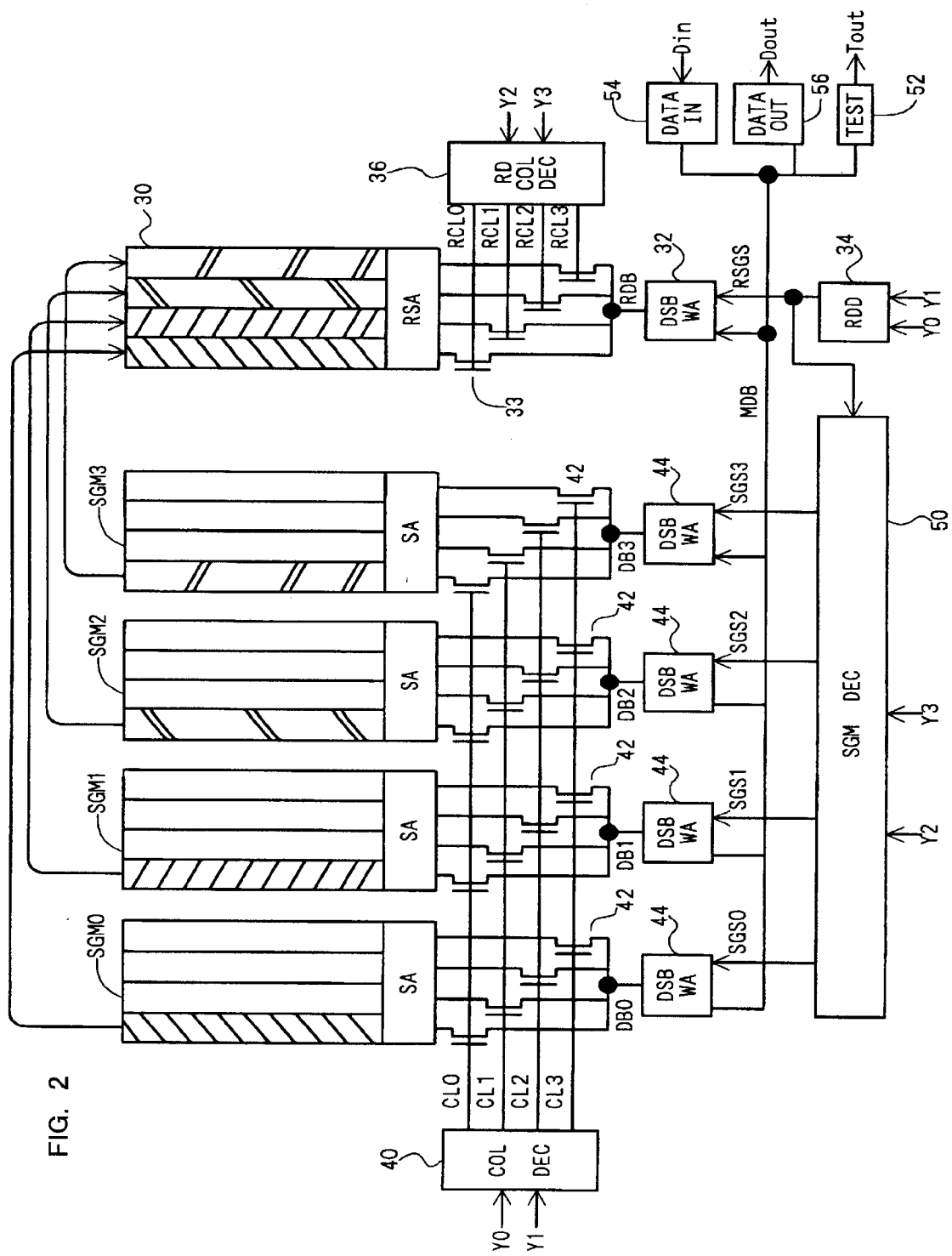
FIG. 2 shows a redundant structure of a first embodiment.

FIG. 2 shows a redundant structure of a first embodiment. The same reference numerals and symbols are used to the parts corresponding to those in the prior art of FIG. 1. In the first embodiment, the structure includes four segments SGM0 to SGM3 and a redundant array 30 having the same capacities as those of the segments. Each segment is formed of four columns. Column selection in each segment is performed by conducting each column gate transistors 42 by column selection signals CL0 to CL3 generated in a column decoder 40. The selected columns are connected to each sense buffers and write amplifiers 44 on the data buses through common data buses DB0 to DB3. In FIG. 2, data bus line pair are illustrated by one data bus and main data bus line pair are illustrated by one main data bus, respectively, for simplicity. Column gate transistors are omitted by one transistor, similarly. When each column is formed of bit line pair, these are also formed to be a pair of lines. The following explanation is given in a case that each column is formed of bit line pair.

One segment is selected from a plurality of segments by segment selection signals SGS0 to SGS3 generated by a segment decoder 50. In detail, the segment selection signals SGS0 to SGS3 activate sense buffers and write amplifiers 44 in each segments, main data bus pair MDB are driven according to the read data of the data bus line pair DB (and /DB) when reading out data, data bus line pair DB (and /DB) are driven according to the write data of main data base bus pair MDB when writing the data.

On the other hand, a redundant cell array 30 having the same capacity as that of the segments is provided. This redundant cell array 30 includes all of the areas concurrently selected on a compression test and is replaced to an area including a defective cell. In other word, as shown in FIG. 2, columns in each segment illustrated by oblique lines are concurrently replaced to redundancy cell array 30.

In the compression test, areas corresponding to column selection signal CL0 generated by column decoder 40 are concurrently selected from each segment. As described above, in the compression test, inputs/outputs of each segment are concurrently connected to a test circuit 52 via a main data bus MDB, and test circuit 52 writes 0 or 1 concurrently and reads the written data concurrently and checks whether or not the memory cells activate normally. If 1 is written to all of the memory cells and 1 is read out from all of the memory cells, a test terminal Tout becomes 1, if 0 is written to all of the memory cells, 0 is read out from all of the memory cells, the test terminal Tout becomes 0, and if the read data are not coincided, the test terminal Tout becomes high impedance. That is, the same data is written from write amplifiers 44 in the plurality of segments via a main data bus MDB. Further, one of the main data bus line pair MDB is driven to L level according to the read data in each segments from a condition where both of the main data bus line pairs MDB are reset to H level. As a result, when the read data are all zero, one of main data bus line pair MDB is driven to L level, when the data are all 1, the other one of main data bus line pair MDB is driven to L level. When both data are not coincided to each other, both main data bus lines are driven to L level. In this way, test circuit 52 can detect three conditions via the main data bus line pair MDB.

As shown in FIG. 2, when columns in each of the segments illustrated by oblique lines are concurrently selected in the compression test and the read data are not coincided, it is apparent from the result that either of these columns illustrated by oblique lines includes a defective cell or bit. Therefore, in this case, the areas including these concurrently selected areas are replaced to redundant cell array 30.

When replacing the areas to redundant cell array 30, column addresses Y0 and Y1 showing areas of the replaced normal cells are stored in a redundant ROM of redundancy detector 34. The column addresses Y0 and Y1 are the same as those supplied to column decoder 40.

On the other hand, as a compression test is executed, as shown in FIG. 2, in the first embodiment, column selection signals RCL0 to RCL3 for selecting column gate 33 in redundant cell array 30 are generated by redundant column decoder 36 according to column addresses Y2 and Y3 supplied to segment decoder 50.

In the semiconductor memory device having the above-described structure of the redundant cell array, a compression test is executed at first. If it is detected that the read data are not coincided when one of column selection signals CL0 to CL3 is selected, the column addresses Y0 and Y1 are recorded in a redundant ROM of redundancy detector 34, not shown in FIG. 2, the area corresponding to the recorded column addresses Y0 and Y1 is replaced to redundancy cell array 30. After that, when the column addresses Y0 and Y1 for generating column selection signals are coincided with the addresses recorded in the redundant ROM, not shown in the diagram, on a normal access operation, the sense buffer and write amplifier 32 on the data bus of the redundant cell array 30 is selected and activated by a redundant selection signal RSGS. Simultaneously, redundant selection signal RSGS makes segment decoder 50 inactivate and makes the generation of segment selection signals SGS0 to SGS3 inhibit. Further, redundant column decoder 36 decodes column addresses Y2 and Y3 for segment selection and generates column selection signals RCL0 to RCL3 for selecting columns from redundant cell array 30. The selected column is connected to the buffer and amplifier 32 is connected to redundant sense buffer and write amplifier 32 and a main data bus MDB by redundant selection signal RSGS.

As described above, areas including the areas in each of the segments concurrently selected in the compression test are replaced to redundant cell array 30. In detail, the addresses decoded by column decoder 40 are stored in a redundant ROM of redundancy detector 34, not shown in the diagram. When the addresses are coincided, replacement to the redundant cell array 30 is performed. In this case, addresses decoded by segment decoder 50 are supplied to column decoder 36 for the redundant cell array 30.

Figure 3:
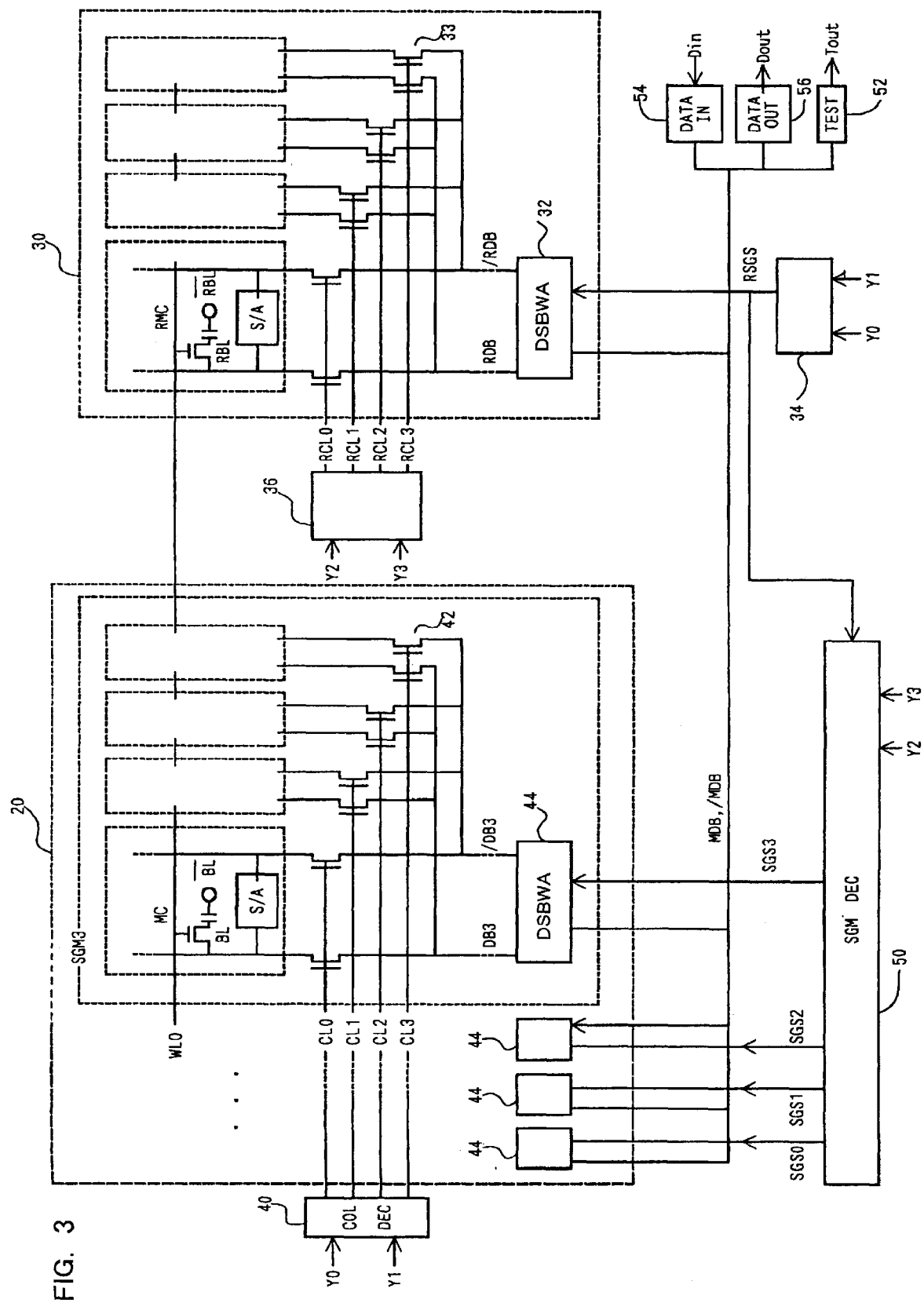
FIG. 3 illustrates a detailed circuitry diagram of a redundant cell array of the first embodiment of FIG. 2.

FIG. 3 illustrates a detailed circuitry diagram of the first embodiment of FIG. 2. The same reference numerals and symbols are attached to the parts corresponding to those of FIG. 2. In the example of FIG. 3, a memory cell MC formed of one transistor and one capacitor is illustrated. Bit line pair BL and /BL are connected to a sense amplifier S/A, and are connected to common data bus line pair DB3 and /DB3 through column selection transistor pair 42. Redundant cell array 30 has the same structure. The other parts are the same as those of the example shown in FIG. 2, and therefore, the explanation will be omitted here.

Figure 4:
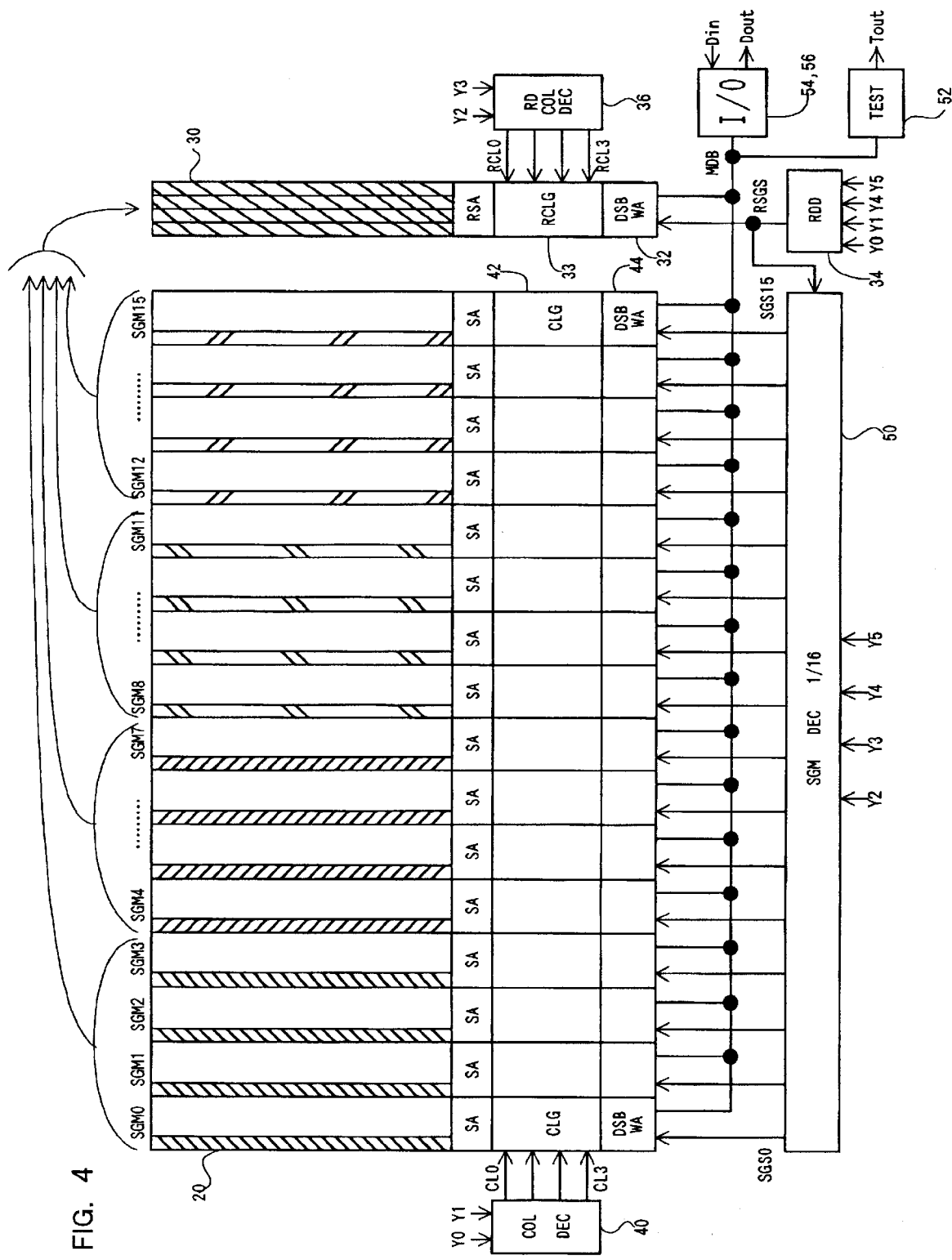
FIG. 4 shows a structure of a redundant cell array of a second embodiment.

FIG. 4 shows a structure of a redundant cell array of a second embodiment. In this embodiment, sixteen segments SGM0 to SGM15 are provided. Each segment has four columns. Therefore, four bits of column addresses Y2 to Y5 are supplied to segment decoder 50, two bits of column addresses Y0 and Y1 are supplied to column decoder 40. Further, redundant cell array 30 has the same capacity of that of one segment. Therefore, all areas illustrated by oblique lines in sixteen segments cannot be replaced to redundant cell array 30.

Therefore, in this embodiment, all of the sixteen segments are not concurrently selected in the compression test, but four segments are concurrently selected. The four segments drive main data bus line pair MDB to which test circuit 52 is connected via sense buffer and write amplifier 44 and vice versa. Then, when the read data are in different conditions or data coincidence cannot be detected, the four segments are replaced to redundant cell array 30 as one unit.

A case where sections illustrated by oblique lines in each segments SGM0 to SGM3 are replaced to redundant cell arrays 30 will be now considered. Column gates Y0 and Y1(=0, 0) for selecting columns in each of the segments and column addresses Y4 and Y5 (=0, 0) for selecting four segments SGM0 to SGM3 are recorded in a redundant ROM of redundancy detector 34. Then, the supplied addresses Y0, Y1, Y4 and Y5 are compared with the addresses recorded in the redundant ROM.

On the other hand, column address Y2 and Y3 for selecting either of four segments SGM0 to SGM3 are supplied to column decoder 36 for redundant cell array 30.

Therefore, one corresponding column for the replaced four segments SGM0 to SGM3 is selected from redundant cell array 30.

In the above-described second embodiment, one part of a plurality of areas in the sixteen segments is replaced to redundant cell array 30. In this case, one part of lower addresses Y2 and Y3 selected from column addresses Y2 to Y5 which are supplied to segment decoder 50 are supplied to redundant column decoder 36. Further, column addresses Y0 and Y1 supplied to column decoder 40 in normal cell array 20 are recorded in redundancy detector 34 with the remaining column addresses Y4 and Y5 for segment decoding.

Figure 5:
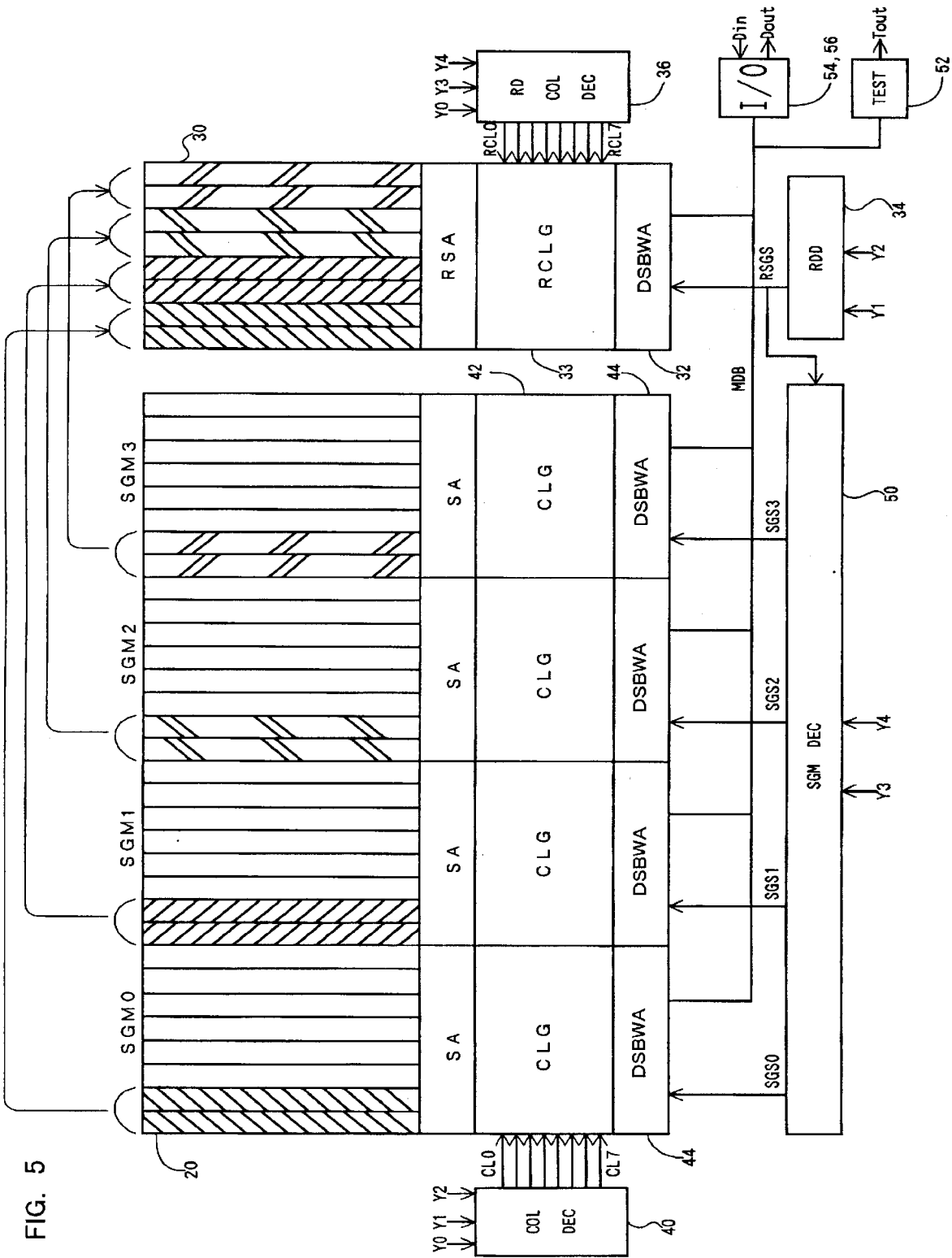
FIG. 5 shows a structure of a redundant cell array of a third embodiment.

FIG. 5 shows a structure of redundant cell array of a third embodiment. In this example, four segments SGM0 to SGM3 are provided in normal cell array 20. Each segment includes eight columns. Further, redundant cell array 30 has the same capacity of that of a segment. Each of the areas having two columns selected from each of the segments SGM0 to SGM3 are concurrently replaced to redundant cell array 30.

Three bits of column addresses Y0, Y1 and Y2 are supplied to column decoder 40 of normal cell array 20, one of eight columns in each segment is selected by column selection signals CL0 to CL7. Further, column addresses Y3 and Y4 for selecting one of four segments are supplied to segment decoder 50.

As shown in FIG. 5, areas of two columns in each of the segments, illustrated by oblique lines in the diagram, are concurrently replaced to redundant cell array 30. Therefore, addresses Y1 and Y2 which are one part of column addresses Y0, Y1, Y2 supplied to column decoder 40 are recorded in redundant ROM of redundancy detector 34. Further, column addresses Y3 and Y4 supplied to segment decoder 50 and the remaining address Y0 supplied to column decoder 40 are supplied to redundant decoder 36 of redundant cell array 30.

In the third embodiment of FIG. 5, a plurality of columns in each of the segments are concurrently replaced to redundant cell array 30. As a defective cell or bit shows a tendency to generate in concentrating to one constant area, this method has a merit for a redundancy method. Therefore, in this case, one part (Y1, Y2) of column addresses supplied to column decoder 40 is stored in redundancy detector 34.

Figure 6:
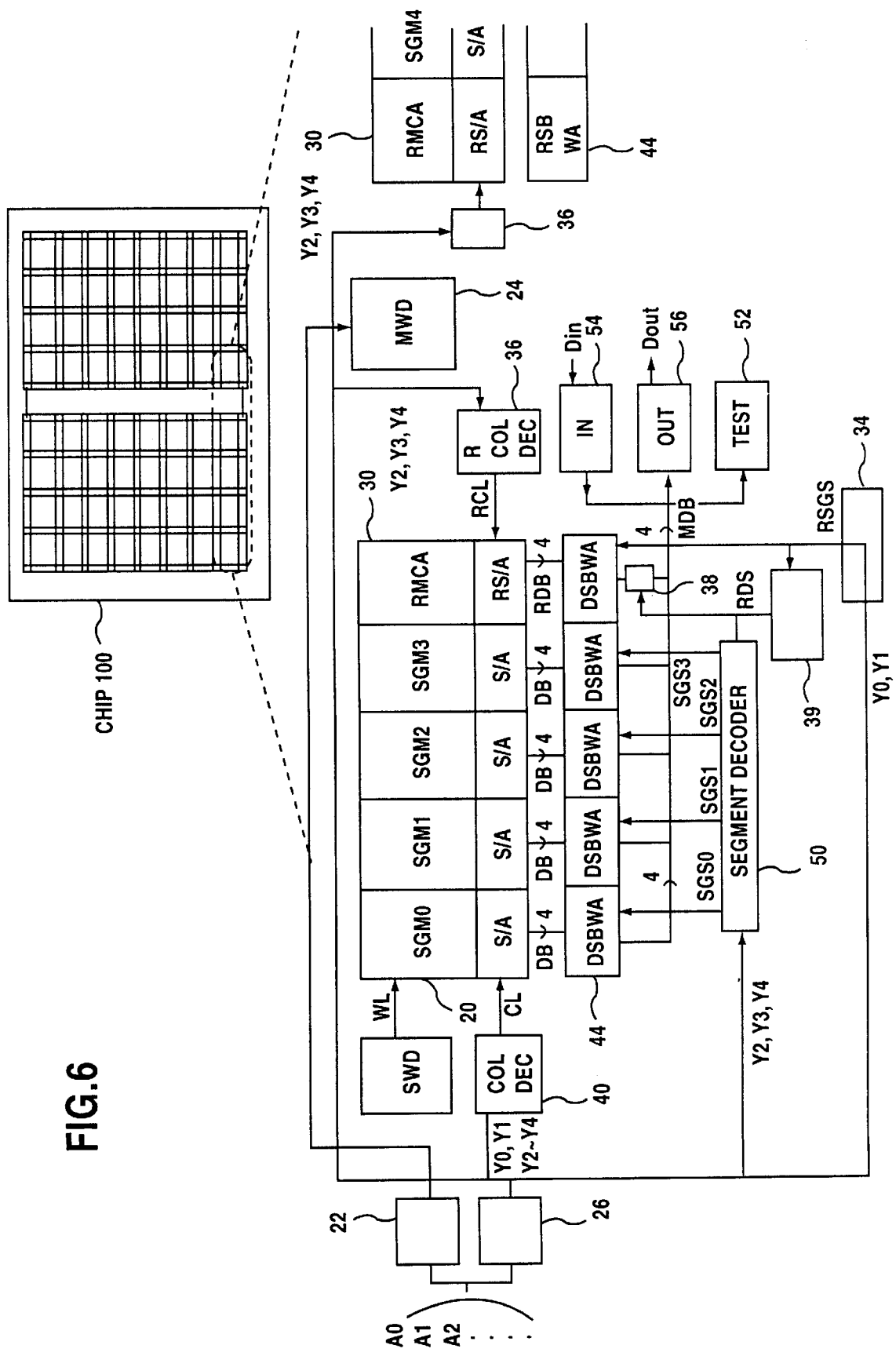
FIG. 6 shows a structure of a redundant cell array of a fourth embodiment.

FIG. 6 shows a structure of a redundant cell array of a fourth embodiment. In the fourth embodiment, an example of a semiconductor memory device having multiple bits of inputs/outputs, in which a plurality of main data buses MDB are connected to one segment, is shown. In this case, sub segments for multiple bits are further included in each segment. In the semiconductor memory device, a redundant input/output bit selector 39 for storing information of sub segments corresponding to which main data bus is replaced to redundant cell array is further provided in addition to redundancy detector 34 for comparing redundant addresses in the structure of redundant cell array. Redundant cell array 30 is connected to main data bus of input/output bits selected by the redundant input/output bit selector 39 to inhibit a selection of the sub segment corresponding to the above-described selected input/output bit in normal cell array 20.

Further, in the fourth embodiment, eight rows of segments SGM0 to SGM7 are arranged on chip 100 on which center a main word decoder 24 is arranged. Four rows of segments 20 for regular cell array and redundant memory cell array 30 are respectively arranged on both sides of main word decoder 24. Column decoders 40 are provided in each segment. Further, sub word decoders SWD are provided on both sides of each of the segments corresponding to main word decoder 24. However, only column decoder 40 and sub word decoder SWD for segment SGM0 are shown in FIG. 6.

Further, four sub segments in each of the segments SGM0 to SGM3 are respectively connected to four main data buses MDB via each sense buffer and write amplifier 44 for each data bus, not depicted in FIG. 6. Segment decoder 50 selects either of segments SGM0 to SGM7 arranged in eight rows. Further, one column is selected from a plurality of columns in each of the sub segments according to column selection signals CL transmitted from column decoder 40, and is connected to the sense buffer and write amplifier 44 in each sub segment. Then, four sense buffers and write amplifiers 44 of the selected segment are connected to four main data buses MDB.

Figure 7:
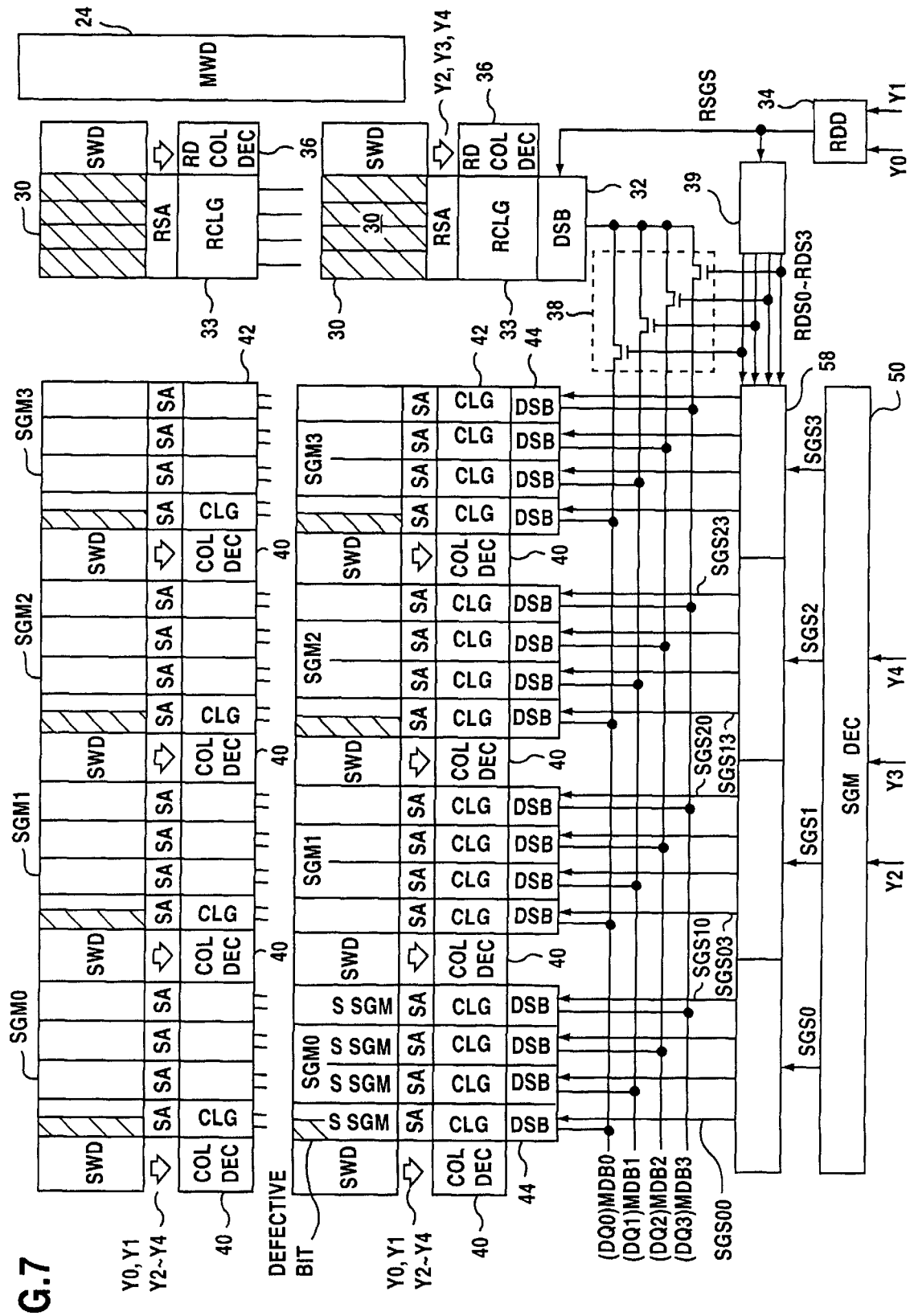
FIG. 7 illustrates a detailed redundant structure of the fourth embodiment.

FIG. 7 shows a detailed redundant structure of the fourth embodiment. A structural example of a redundant cell array in a memory device having four bits of inputs and outputs will be now explained in accompanying to FIG. 7. In FIG. 7, a redundant cell array 30 and four segments SGM0 to SGM3 arranged on the left side of main word decoder 24 (MWD) are depicted. Further, as shown in an entire diagram of a chip of FIG. 6, eight rows of redundant cell array 30 and four segments SGM0 to SGM3 are arranged in eight columns, but only two rows of them are shown in FIG. 7.

Each segment SGM respectively includes four sub segments SSGM. A memory cell array, sense amplifier SA, column gate 42 (CLG), data bus, sense buffer and write amplifier 44 (DBS) for data bus, and column decoder 40 are provided for each sub segment. Sense buffer and write amplifier 44 (DSB) in each sub segment is connected to four main data buses MDB0 to MDB3. The main data buses MDB0 to MDB3 are respectively connected to input/output terminals DQ0 to DQ3 through I/O circuits, not shown in FIG. 7.

The output from main word decoder 24 is supplied to sub word decoder SWD to select a word line of each segment. Sub word decoders SWD are respectively provided on both sides of four segments SGM, and therefore, five sub word decoders SWD are provided on the left side of main word decoder 24. With this structure, only one word line in each segment arranged in a row is selected.

On the other hand, column decoder 40 provided in each segment is arranged at lower portion of the sub word decoder SWD on this layout, as shown in FIG. 7. Column addresses Y0 to Y4 are provided to each column decoder 40 arranged in a column direction for the plural rows of segments. That is, the column addresses Y0 to Y4 are wired in a column direction as shown in FIG. 7. One column is selected from four columns in each sub segment according to the column addresses Y0 and Y1. Column addresses Y2 to Y4 are addresses for segment selection to activate only the column decoder 40 belonging to the selected segment SGM. As a result, column decoders 40 belonging to the non-selected segments become inactive, and therefore, it becomes possible to prevent useless consumption of the current.

Column decoder 40 supplies common column selection signals CL0 to CL4, not shown in FIG. 7, for four sub segments in each segment. Therefore, sense amplifier SA of a column selected by the same column selection signal from each of the sub segments is connected to data bus line pair, not shown in the diagram, and sense buffer and write amplifier 44 (DBS) via each column gate 42 (CLG).

On a normal operation, a segment in normal cell array 20 is selected by segment selection signals SGS0 to SGS3 generated by segment decoder 50. Each of the sense buffers and write amplifiers 44 (DSB) of four sub segments SSGM in the selected segment SGM are activated and connected to four main data buses MDB0 to MDB3. Column addresses Y2 to Y4 for segment selection are supplied to segment decoder 50. That is, one segment SGM is selected from eight segments SGM0 to SGM7 on both sides of main word decoder 24 in one chip.

In the structure of the memory, a compression test activates all column decoders 40, selects each of the sense amplifiers of each of the sub segments by the column selection signals CL0 to CL3, not shown in the diagram, and concurrently connects sense buffers and write amplifiers 44 of the sub segments to a test circuit 52, not shown in the diagram, via main data bus line pairs MSB0 to MDB3. Test circuit 52 can concurrently read and determine for the four sub segments from each segment SGM by employing main data bus line pairs as described above. As a result, the time required for testing can be reduced in the compression test, similarly to the case of input and output terminal of one bit.

In the structure of the redundant cell array of the fourth embodiment, an area including a defective bit in a sub segment of each segment concurrently selected in the compression test can be replaced to a redundant memory cell array 30. As shown by oblique lines in FIG. 7, if a defective bit exists in sub segment SSGM of segment SGM0, it becomes apparent from the compression test that the defective bit exists in either of oblique lined areas of each of the sub segments SSGM of each of the segments SGM0 to SGM3. Then, cell arrays on these areas illustrated by oblique lines are replaced to redundant cell array 30. Therefore, column addresses Y2 to Y4 for segment selection are supplied to column decoder 36 of redundant cell array 30, and one column in redundant cell array 30 is selected according to the segment selection.

Further, as the redundant cell array 30 can be replaced only for areas in one part of sub segments of a segment, information showing which segment, i.e., which main data bus MDB and input/output terminal DQ is replaced to a redundant cell array is stored in a ROM, not shown in FIG. 7, of a redundant input/output bit selector or a redundant main data bus selector 39. Further, redundant main data bus gate 38 for connecting one of main data bus MDB to the output from redundant cell array is provided between sense buffer and write amplifier (DSB) 32 and main data buses MDB.

In here, it is supposed that the areas shown by oblique lines of FIG. 7 are replaced to redundant cell array, and then, a defective bit exists in columns of the areas, for example, columns of (Y0~Y4)=(0~0) in sub segments for input/output terminal DQ0. In this case, columns of (Y0, Y1)=(0, 0) in segments SGM0 to SGM3 corresponding to (Y2, Y3)=(0, 0), (0, 1), (1, 0), (1, 1) are replaced to redundant cell array 30. (Y0, Y1)=(0, 0) is stored in a redundant ROM, not shown in the diagram, of redundancy detector 34. Further, DQ0 is stored in the redundant main data bus selector 39.

Then, it is supposed that either bit in the area illustrated by oblique line is selected. Redundancy detector 34 compares the supplied addresses Y0 and Y1 with the stored (0, 0) in the redundant ROM, determines both addresses are coincided, and outputs the redundant selection signal RSGS. Sense buffer and write amplifier 32 of the redundant cell array 30 is selected and activated according to redundant selection signal RSGS. Then, a column corresponding to the selected segment from columns in redundant cell array 30 is selected by a column selection signal generated by redundant column decoder 36 from the column addresses Y2 to Y4 for segment selection. Then, the column address Y4 means the address for left and right sides of main word decoder 24, the redundant column decoder 36 is activated when Y4=0 for selecting the left side.

Redundant selection signal RSGS is also supplied to redundant main data bus selector 39. Information of which one of four sub segments is replaced to redundant cell array 30 is recorded in redundant main data bus selector 39. Therefore, when redundant selection signal RSGS is supplied, redundant main data bus selector 39 makes either of redundant main data bus selection signals RDS0 to RDS3 selective and makes a selection signal SGS00 to the corresponding sub segment non-selective. Other selection signals SGS01 to SGS03 transmitted to the other sub segments in the segments are selective as they are. This control is executed by sub segment selector 58.

In the layout of FIG. 7, the same column addresses Y0 to Y4 are arranged and supplied in a column direction for a plurality of column decoders arranged on a column direction. Column decoders 40 are arranged by employing areas where sub word decoders SWD are arranged. Simultaneously, column addresses Y0 to Y4 are arranged and supplied in a column direction to a plurality of redundant column decoders 36 arranged on a column direction. The redundant column decoders 36 are also arranged by employing areas of sub word decoders SWD for the redundant cell array 30.

Figure 8:
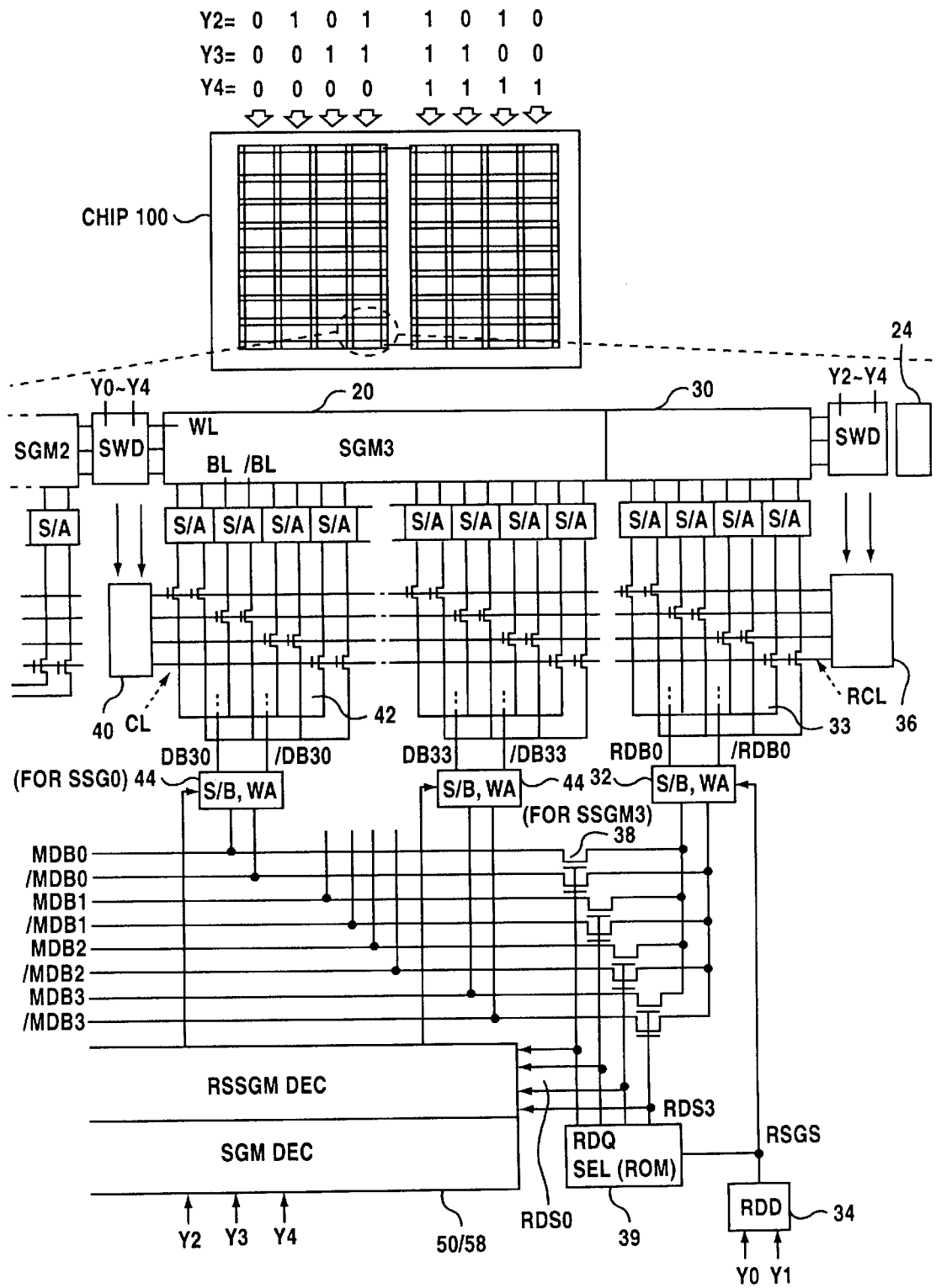
FIG. 8 illustrates a detailed redundant structure of the fourth embodiment.
Figure 9:
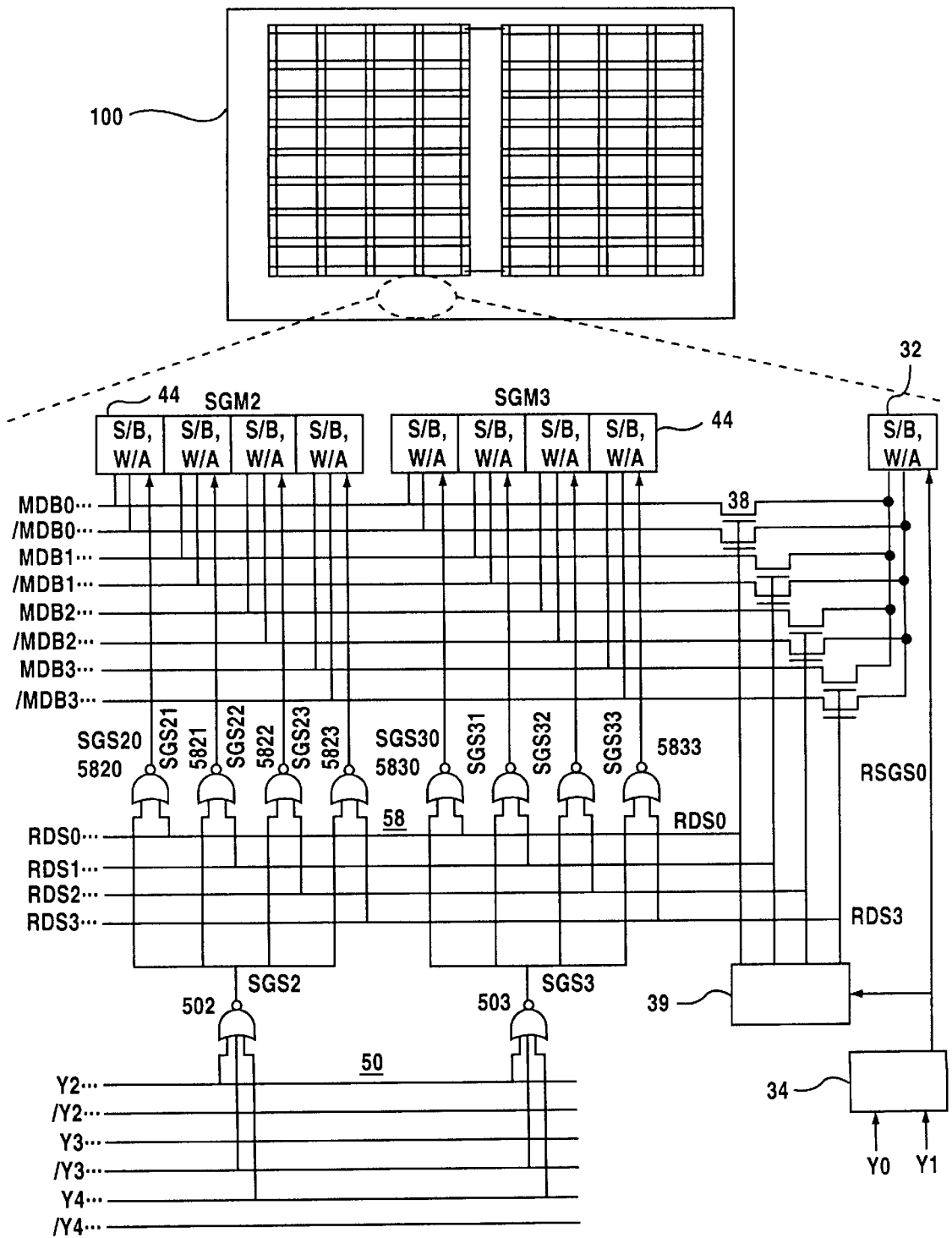
FIG. 9 illustrates a detailed redundant structure of the fourth embodiment.

FIGS. 8 and 9 are detailed circuitry diagrams for illustrating column gates 42, 33, main data buses MDB, column decoders 40, 36, sub segment selector 58 and column decoder 50. Each sense amplifier S/A, column decoder 40, redundant column decoder 36, column gate 42, redundant column gate 33, sense buffer and write amplifier 44 for segment SGM3 of normal cell array 20, and redundant sense buffer and write amplifier 32 for redundancy cell array 30 are illustrated in FIG. 8. Further, main data buses MDB and /MDB, to which each of the sense buffers and write amplifiers 44 in normal cell array are connected, and redundant main data bus gate 38 are also illustrated in FIG. 8.

It becomes apparent from FIG. 8 that data bus line pair DB and /DB of each of the sub segments are arranged over cell arrays in a column direction.

A detailed circuit of segment decoder 50 and sub segment selector 58 for segments SGM2 and SGM3 are illustrated in FIG. 9. Segment decoder 50 includes NAND gates 502 and 503 to which a predetermined combination of inverted and non inverted signals of column addresses Y2, Y3 and Y4 are input. NAND gates 502 and 503 generates selective L level of segment selection signals SGS2 and SGS3.

Sub segment selector 58 includes NOR gates 5820 to 5823 and 5830 to 5833 to which redundant main data bus selection signals RDS0 to RDS3 and segment selection signals SGS2 and SGS3 are supplied. When segment selection signal SGS2 or SGS3 is selective L level and all of redundant main data bus selection signals RDS0 to RDS3 are non-selective L level, each NOR gate 5820 to 5823, 5830 to 5833 supplies a selective H level of signal SGS20 to SGS23, SGS30 to SGS33 to a sense buffer and write amplifier 44 in each sub segment. Even if segment selection signal SGS2 or SGS3 is selective L level, each NOR gate 5820 to 5823, 5830 to 5833 supplies non-selective L level of signal to sense buffer and write amplifier 44 so as to inhibit sub segment in normal cell array to connect to main data bus when one of the redundant main data bus selection signals RDS0 to RDS3 are selective H level. Then, redundant main data bus gates 38 corresponding to main data bus pair MDB0 and /MDB0 becomes conductive in response to a H level of selection signal of redundant main data bus selection signal RDS0, and sense buffer and write amplifier 32 for the redundant cell array is connected to the selected main data bus line pair MDB0 and /MDB0. As a result, one sub segment is replaced to the redundant cell array, and the remaining sub segments and the replaced redundant cell arrays are connected to four main data bus line pairs MDB0,/MDB0 to MDB3, /MDB3.

As described above, although a memory cell of DRAM formed of one transistor and one capacitor is employed as an example in the above described embodiments, the present invention is also applicable to a solid-state memory device, such as SRAM or EEPROM.

As explained above, according to the present invention, a normal cell array is formed of a plurality of segments each having common data buses, the corresponding memory cell areas in each of the segments for the normal memory cell array including the plurality of segments are concurrently replaced to a redundant cell array including the common redundant data buses. Therefore, a defective area obtained by a compression test for testing the write and read for the plurality of memory cells by concurrently selecting the plurality of segments can be replaced to a redundant cell array. Therefore, a structure of redundant cell array in which a compression test can be employed for detecting a defective bit can be provided.

According to the present invention, if memory cells in the plurality of segments are replaced to a redundant cell array, it is possible to write to and read from a suitable memory cell in the redundant cell array on a normal operation by giving, at least, one part of the addresses for segment selection which is supplied to a segment decoder to the column decoder of the redundant cell array.

Additionally, according to the present invention, a redundancy detector for detecting whether or not a redundant cell array is selected stores, at least, one part of the addresses for column selection supplied to a column decoder in a normal cell array which are corresponding to a defective cell. Therefore, it becomes possible to detect a suitable access to the redundant cell array on a normal operation.

Further, according to the present invention, in a structure of multiple bits of inputs/outputs, it is possible to replace the normal cell array including a defective cell to the redundant cell array in each input/output bit by storing an information of an input/output bit corresponding to a replaced cell array in a redundant main data bus selector.

What is claimed is:

1. A semiconductor memory device, comprising:

a normal cell array including a plurality of segments each having a common data bus;

a redundant cell array including a redundant common data bus;

a main data bus commonly coupled to the common data buses of the plurality of segments and to the redundant common data bus of the redundancy cell array, wherein cell array areas in the plurality of segments are concurrently replaceable to a cell array area in the redundancy cell array.

2. A semiconductor memory device comprising:

a normal cell array including a plurality of segments each having a common data bus;

a redundant cell array including a redundant common data bus;

a main data bus commonly coupled to the common data buses of the plurality of segments and to the redundant common data bus of the redundancy cell array, wherein cell array areas in the plurality of segments are replaceable to a cell array area in the redundancy cell array;

a column decoder, to which column selection addresses are supplied, for supplying a column selection signal to the plurality of segments;

a segment decoder, to which segment selection addresses are supplied, for supplying a segment selection signal to the segment;

a redundancy selector for storing, at least, one part of the column selection addresses corresponding to a defective cell and generating a redundant selection signal for selecting a redundant cell array when the supplied addresses are coincided with the stored address; and a redundant column decoder, to which, at least, one part of the segment selection addresses are supplied, for supplying a redundant column selection signal to the redundant cell array.

3. A semiconductor memory device comprising:

a normal cell array including a plurality of segments each having a common data bus;

a redundant cell array including a redundant common data bus;

a main data bus commonly coupled to the common data buses of the plurality of segments and to the redundant common data bus of the redundancy cell array, wherein cell array areas in the plurality of segments are replaceable to a cell array area in the redundancy cell array;

a test circuit to which the plurality of segments are connected via the main data bus in response to the column selection signal of the column decoder, wherein when memory cells in the plurality of segments are concurrently selected and a defective cell is detected by the test circuit, cell array areas in the concurrently selected plurality of segments are replaced to the cell array area in the redundant cell array.

4. A semiconductor memory device, comprising:

a normal cell array including M segments (M means plural) each having N sub segments (N means plural) each having a common data bus; and a redundant cell array including a redundant common data bus; and N main data buses commonly provided to the data buses of the corresponding M sub segments in the M segments, wherein cell array areas of the corresponding M sub segments in the M segments are replaceable to cell array area connected to the redundant common data buses of the redundancy cell array.

5. The semiconductor memory device according to claim 4, further comprising:

a column decoder, to which column selection addresses are supplied, for supplying a common column selection signal to the plurality of segments;

a redundant selector for storing, at least, one part of the column selection addresses which correspond to a defective cell and generating a redundant selection signal for selecting a redundant cell array when the supplied addresses are coincided with the stored address;

a redundant main data bus selector for storing data of the main data bus to which the corresponding sub segments replaced to the redundant cell array are connected and generating a redundant data bus selection signal in response to the redundant selection signal;

segments and sub segment decoder, to which segment selection addresses are supplied, for supplying a segment selection signal generated from the segment selection addresses to sub segments which are not replaced to the redundant cell array in response to the redundant main data bus selection signal, and for inhibiting the segment selection signals to sub segments which are replaced to the redundant cell array;

gates for connecting the main data bus corresponding to the replaced sub segment of the N main data buses and the redundant data bus of the redundant cell array in response to the redundant main data bus selection signal; and a redundant column decoder, to which, at least, one part of the segment selection addresses, for supplying a redundant column selection signal to the redundant cell array.

* * * * *

UNITED STATES PATENT AND TRADEMARK OFFICE
CERTIFICATE OF CORRECTION

PATENT NO. : 5,907,515

DATED : May 25, 1999

INVENTOR(S) : Hatakeyama

It is certified that error appears in the above-identified patent and that said Letters Patent is hereby corrected as shown below:

```
Title page,
    Item [22], delete "Jun. 7, 1998", insert therefor

-- Jun. 1, 1998 --
```

Signed and Sealed this

Twelfth Day of October, 1999

Attest:

Q. TODD DICKINSON

*Attesting Officer*  *Acting Commissioner of Patents and Trademarks*